United States Patent
Simpson et al.

(10) Patent No.: US 9,614,693 B2
(45) Date of Patent: Apr. 4, 2017

(54) SELF-CHARACTERIZING, SELF CALIBRATING AND SELF-MEASURING IMPEDANCE TUNERS

(71) Applicant: Maury Microwave, Inc., Ontario, CA (US)

(72) Inventors: Gary R. Simpson, Fontana, CA (US); Steven M. Dudkiewicz, Ontario, CA (US)

(73) Assignee: Maury Microwave, Inc., Ontario, CA (US)

( * ) Notice: Subject to any disclaimer, the term of this patent is extended or adjusted under 35 U.S.C. 154(b) by 87 days.

(21) Appl. No.: 14/525,105

(22) Filed: Oct. 27, 2014

(65) Prior Publication Data
US 2015/0117506 A1  Apr. 30, 2015

Related U.S. Application Data

(60) Provisional application No. 61/897,160, filed on Oct. 29, 2013.

(51) Int. Cl.
| | |
|---|---|
| *H03H 7/38* | (2006.01) |
| *H04L 25/02* | (2006.01) |
| *H04W 24/08* | (2009.01) |
| *H03H 7/40* | (2006.01) |
| *H01P 1/12* | (2006.01) |
| *H01P 1/15* | (2006.01) |
| *H01P 1/18* | (2006.01) |
| *H04B 1/04* | (2006.01) |
| *H04B 1/18* | (2006.01) |

(52) U.S. Cl.
CPC .......... *H04L 25/0278* (2013.01); *H01P 1/127* (2013.01); *H01P 1/15* (2013.01); *H01P 1/18* (2013.01); *H03H 7/40* (2013.01); *H04B 1/04* (2013.01); *H04B 1/18* (2013.01); *H04L 25/0298* (2013.01); *H04W 24/08* (2013.01)

(58) Field of Classification Search
CPC ....................................................... H03H 7/40
USPC ......................................... 333/17.3, 263, 32
See application file for complete search history.

(56) References Cited

U.S. PATENT DOCUMENTS

| | | |
|---|---|---|
| 7,034,629 B2 | 4/2006 | Tsironis |
| 7,053,628 B1 | 5/2006 | Tsironis |
| 7,589,601 B2 | 9/2009 | Simpson |

(Continued)

OTHER PUBLICATIONS

Operating Manual, Automated tuner System, PC Based Application Software, MT993-2 Rev M, 9/300/2008, Chapter 5.

(Continued)

*Primary Examiner* — Stephen E Jones
(74) *Attorney, Agent, or Firm* — Larry K. Roberts

(57) ABSTRACT

An impedance tuner system, usable in a measurement system including at least one measurement system device, the tuner system comprising the impedance tuner having a signal transmission line, and an impedance-varying system coupled to the transmission line, and responsive to command signals to selectively vary the impedance presented by the impedance tuner. An impedance tuner controller is configured to generate the command signals, and wherein measurement device drivers and at least one of characterization, calibration and measurement algorithms are embedded into the tuner controller, the tuner controller configured to allow a user to control execution of said at least one of the characterization, calibration and measurement algorithms using the tuner controller.

21 Claims, 12 Drawing Sheets

(56) References Cited

U.S. PATENT DOCUMENTS

| 8,188,816 B1 | 5/2012 | Tsironis |
|---|---|---|
| 8,212,628 B1 | 7/2012 | Tsironis |
| 8,410,862 B1 | 4/2013 | Tsironis |
| 8,427,255 B1 | 4/2013 | Tsironis |
| 8,823,392 B2 | 9/2014 | Meierer |
| 2010/0030504 A1 | 2/2010 | Simpson |
| 2012/0049970 A1 | 3/2012 | Simpson |
| 2012/0259911 A1 | 10/2012 | Meierer |

OTHER PUBLICATIONS

Christos Tsironis, et al., A Four Harmonic Wideband Impedance Tuner, Focus Microwaves, Inc., 2009.
Patent Cooperation Treaty (PCT) International Search Report and Written Opinion of the International Searching Authority, for PCT 20014/062569, Feb. 17, 2015.

TUNING CONTROL (84B)

TUNER CHARACTERIZATION ALGORITHMS (84C)

CALIBRATION ALGORITHMS (84D)

MEASUREMENT ALGORITHMS (84E)

SYSTEM DEVICE DRIVERS (84F)
- RF SIGNAL GENERATOR (84F1)
- RF AMPLIFIER(S) (84F2)
- POWER METER(S) (84F3)
- VNA (84F4)

COMMUNICATION SERVERS (84G)
- WI-FI (84G1)
- BLUE TOOTH (84G2)
- TELNET (84G3)
- FTP (84G4)
- HTTP (84G5)

COMMAND INTERPRETER (84H)

TCP/IP SOCKET (84 I)
USB (84J)

FILE SYSTEM (84K)
- CALIBRATION DATA (84K1)
- DE-EMBEDDING DATA (84K2)
- WEB PAGES (84K3)
- JAVA APPLETS (84K4)
- SETUP DEFINITIONS (84K5)
- CONFIGURATION DATA (84K6)
- FIRMWARE FILES (84K7)
- MEASUREMENT DATA (84K8)

SELF-CHARACTERIZING, SELF CALIBRATING AND SELF-MEASURING IMPEDANCE TUNERS

CROSS-REFERENCE TO RELATED APPLICATIONS

This application claims priority from U.S. Provisional Application No. 61/897,160, filed Oct. 29, 2013, the entire contents of which application are hereby incorporated by reference.

BACKGROUND

A device characterization measurement system is one that measures certain parameters of a Device Under Test (DUT) by sampling and measuring signals applied to and coming from the DUT.

Such a system may use various instruments, such as signal generators, spectrum analyzers, power meters, network analyzers in order to characterize the DUT.

A "tuner system", "automated tuner system", "impedance tuner system" or "load pull system" refers to a device characterization measurement system which uses some form of impedance tuner(s) to control the impedance(s) seen by the DUT, and measure certain parameters as a function of varying impedance.

Impedance tuners may be mechanical and utilize mismatch probes, or solid-state and utilize switches or diodes. As used herein, "probes" will refer to mismatch probes.

The specific position of mismatch probe, or the state of the switch or diode, will dictate the impedance presented to the DUT.

Impedance tuners may be "manual tuners" where the impedance tuner is manually controlled by the user without influence of a computer, or "automated tuners" which are controlled by a computer or microprocessor.

Automated impedance tuners use some form of software, either embedded within the tuner or standalone on an external computer, to control the probe position or impedance state.

External software, i.e. software installed not within the tuner's memory but on a separate and distinct computer system, is used to characterize a tuner which associates scattering parameters (s-parameters) with tuner positions or states.

External software is used to perform calibration and measurements, which includes communicating with various instruments in the tuner system, reading data from said instruments and de-embedding results to the DUT reference plane.

BRIEF DESCRIPTION OF THE DRAWINGS

Features and advantages of the disclosure will readily be appreciated by persons skilled in the art from the following detailed description when read in conjunction with the drawing wherein:

FIG. 1B is a functional block diagram of exemplary embodiment of a tuner controller for the system of FIG. 1A, 1C or 1D.

FIG. 2B illustrates an exemplary tuner characterization file.

DETAILED DESCRIPTION

Figure 1:
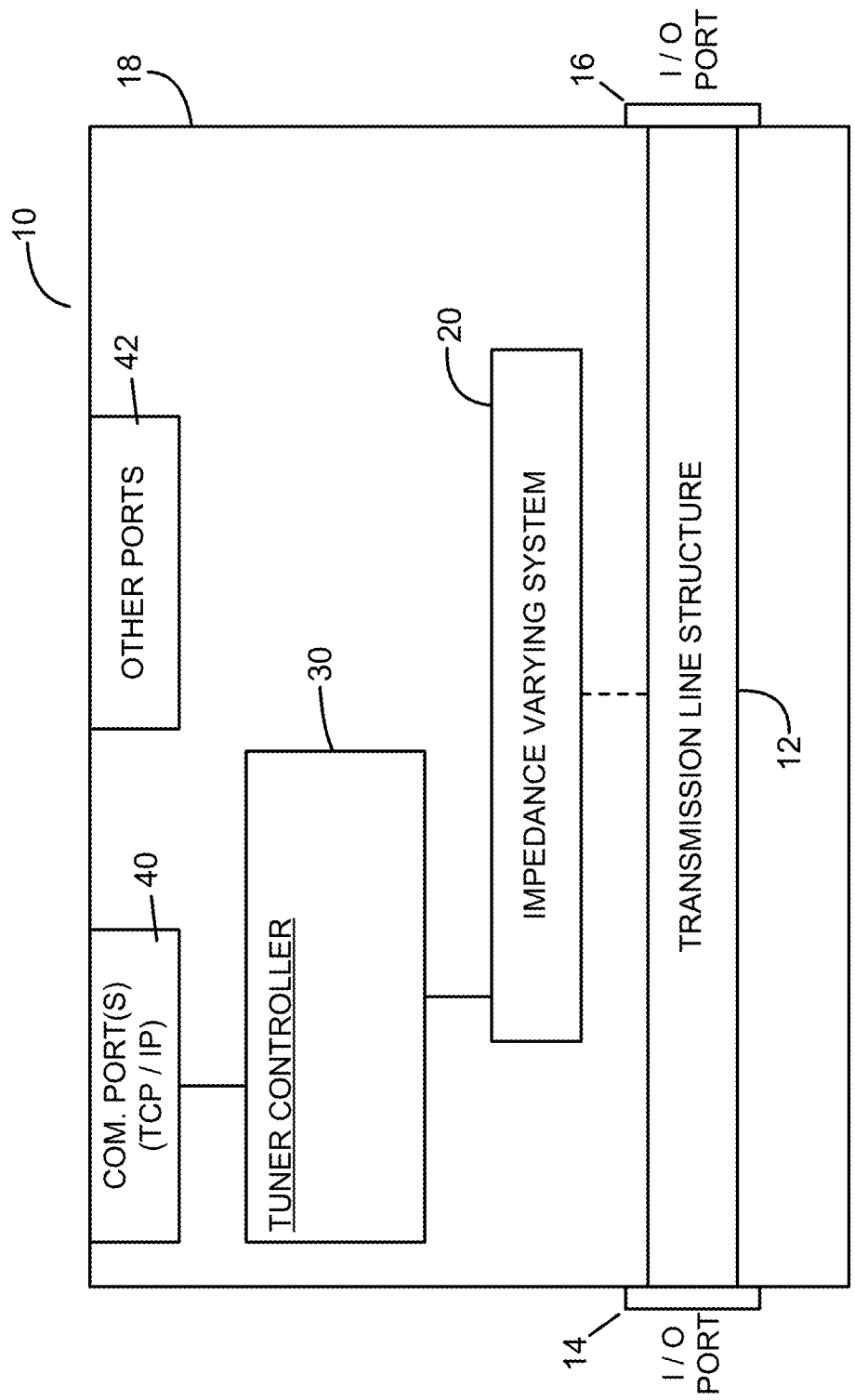
FIG. 1 is a simplified schematic diagram of a tuner system with an integrated controller system. As used herein, "controller" refers to a tuner controller.

In the following detailed description and in the several figures of the drawing, like elements are identified with like reference numerals. The figures are not to scale, and relative feature sizes may be exaggerated for illustrative purposes.

In a general sense, an impedance tuner system includes a signal transmission line and an impedance-varying system coupled to the transmission line. FIG. 1 is a simplified block diagram of an exemplary tuner system 10, including the RF signal transmission line 12 with I/O ports 14 and 16. An impedance varying system 20 is coupled to the signal transmission line to selectively affect the impedance presented by the signal transmission line, as is well known in the art. In one exemplary embodiment, the impedance tuner can be an electromechanical tuner with the typical features of a transmission line, one or more probes mounted on one or more probe carriages, and motors for moving the probes and carriages in the horizontal and vertical axes relative to a transmission line axis. The tuner 10 can have sensors such as position detection sensors to limit the horizontal and vertical movements of the probes, and obtain initialization information regarding the carriages. In other embodiments, the impedance tuner can be a solid state tuner, with impedance variation achieved by applying control signals to solid state elements.

A tuner controller 30 is provided to convert user commands such as desired gamma settings for a selected frequency into electronic control signals for controlling the impedance-varying system. The tuner controller 30 can be mounted on board the impedance tuner, i.e. integrated with the tuner and inside of, or supported by, the tuner housing, or it can be external to the tuner housing. In the case of an electromechanical tuner, the control signals can include motor drive commands for positioning the probe or probes at a desired position or positions to affect the impedance. The tuner controller 30 in this embodiment is connected to communication port(s) 40, and includes communication server and memory functions. The tuner 10 typically has other ports 42, such as a power input port, a USB port and the like. The communication port(s) may be capable of TCP/IP support, e.g. an RJ-45 Ethernet port.

Figure 2A:
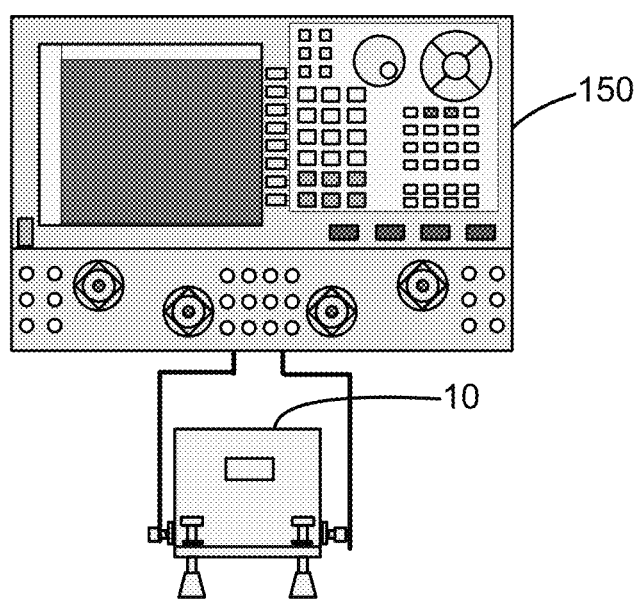
FIG. 2A diagrammatically illustrates an impedance tuner connected to a vector network analyzer (VNA).

An impedance tuner is often "characterized" on a vector network analyzer (VNA) before it can be intelligently used as part of an automated tuner system (FIG. 2A). Here, an impedance tuner 10 is connected to a VNA 150 for the characterization process.

Figure 2B:
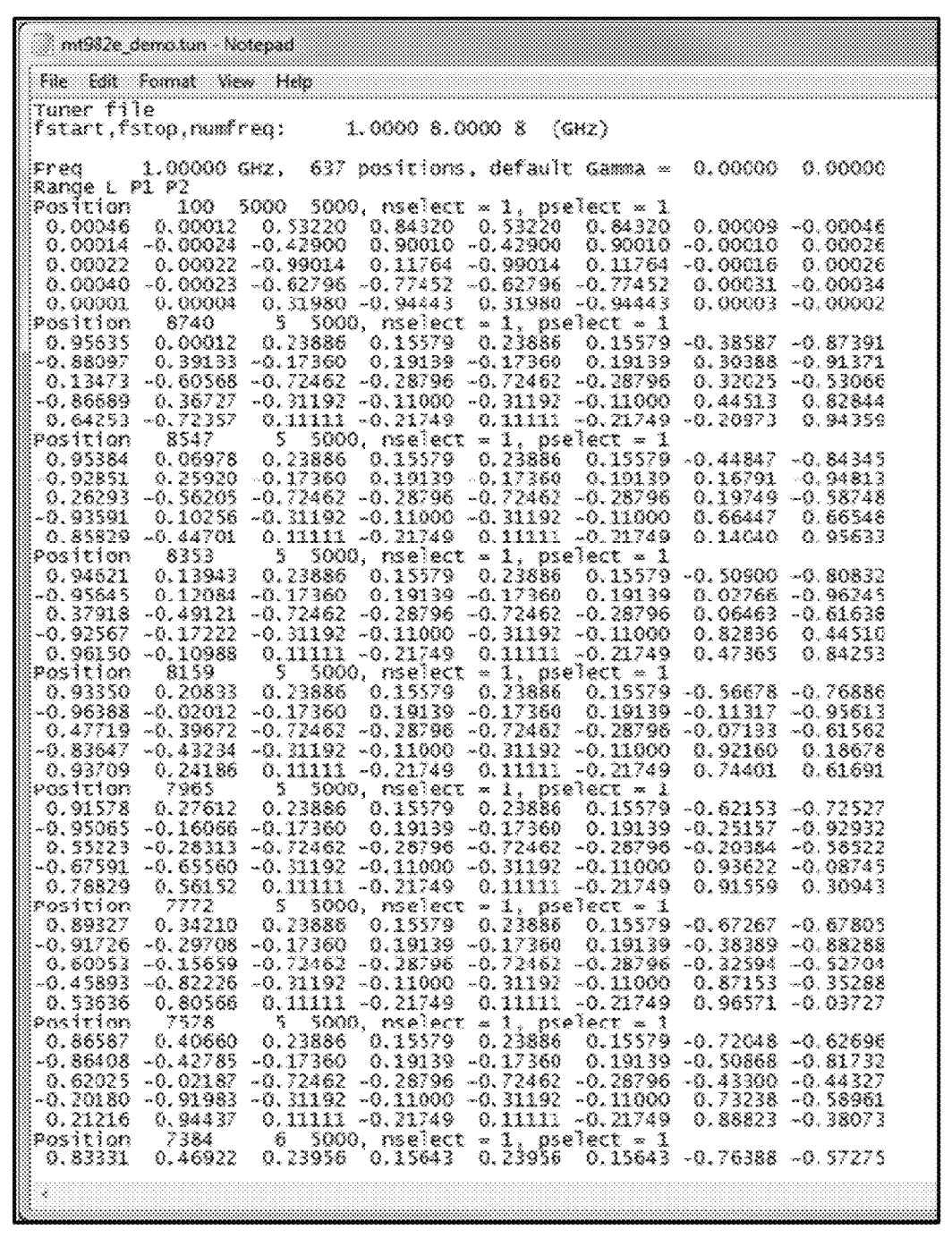

Tuner characterization involves recording the scattering parameters (s-parameters) of the tuner as a function of probe position or tuner state. The results are often stored in tabular format or in a database. FIG. 2B shows a screen shot of an exemplary tuner characterization table.

S-parameters are typically used in determining the correct tuner position or state in order to present the user-specified impedance to the DUT. The S-parameters of the tuner can be cascaded with the s-parameters of additional components within the system in order to de-embed or shift reference planes. This is important when the DUT is not directly connected to the impedance tuner, or when the measurement instrument is not directly connected to the impedance tuner, and losses and phase shifts must be taken into account.

External software is used to perform tuner characterization. This software resides on an external computer, and contains software drivers to communicate with VNAs. Software drivers contain specific commands that may be unique to each instrument. The external software also contains a software driver for the tuner system, and the characterization algorithm which drives the tuner, communicates with the VNA via drivers, and records characterization data in a table or database. Exemplary characterization procedures and algorithms are described in the operating manual for the Maury Microwave impedance tuner, MT993-2, Rev M, Chapter 5, September 2008, by way of example.

Once an impedance tuner is characterized, it is assembled into a measurement system along with measurement system devices. As used herein, a "system device" is any component of the measurement system, and may include instruments, such as a signal generator and power meter. In this example, the signal generator is used to generate and inject the test signal into the DUT, the impedance tuner is used to vary the impedance presented to the DUT, and the power meter is used to record the output power of the DUT.

Figure 3:
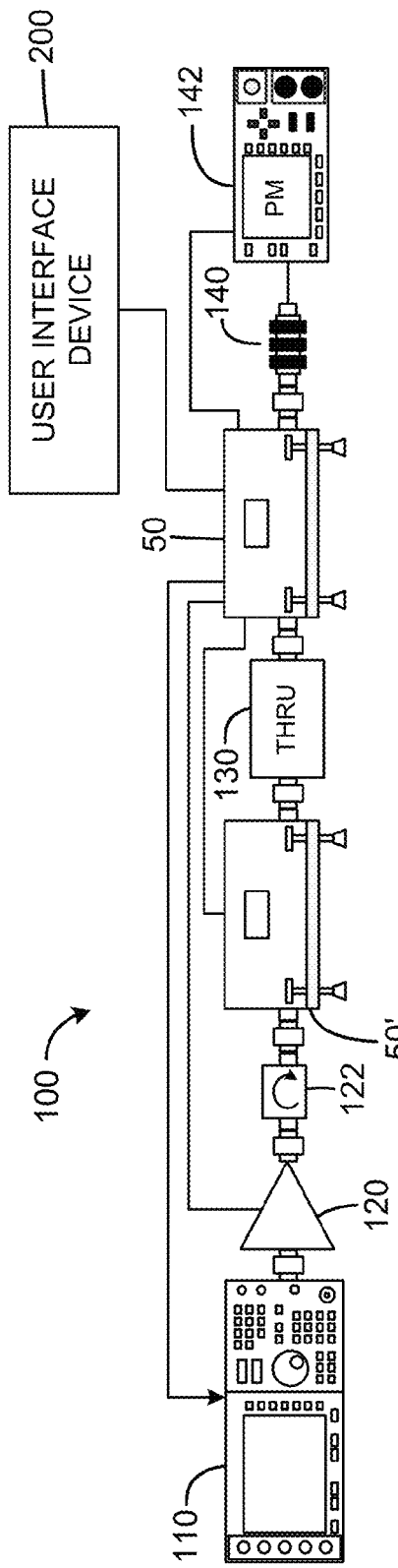
FIG. 3 illustrates a block diagram of an exemplary embodiment of a tuner system connected on a THRU, i.e. a direct connection or a transmission line connection of some known length and scattering parameters, for system calibration
Figure 8:
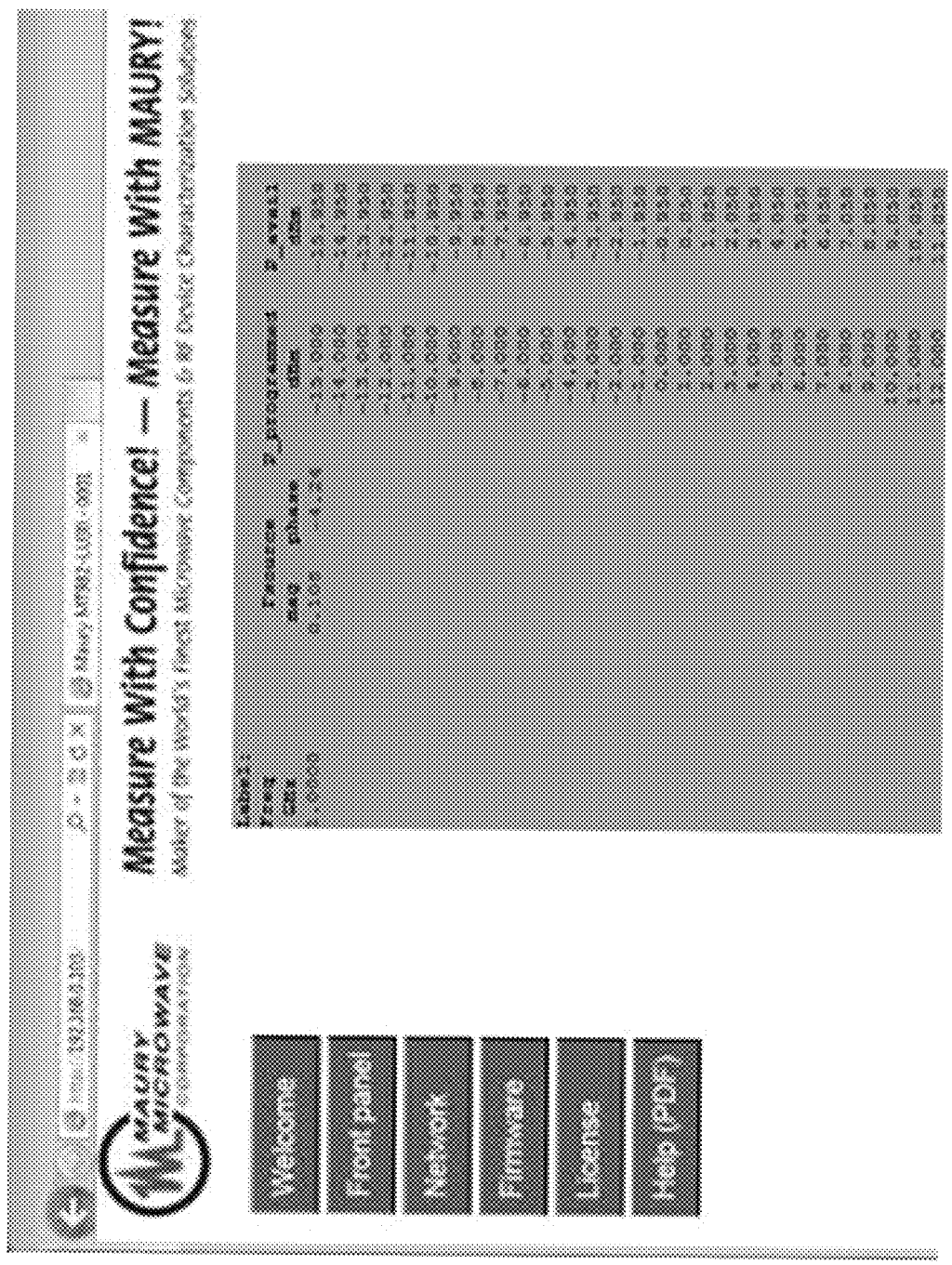
FIG. 8 shows a screen shot on an exemplary TUNER APP system calibration measurement page.

The "system-calibration" or "power-calibration" of the tuner system can involve connecting the system as shown in FIG. 3 on a THRU, without the DUT connected. The relationship between the signal generator power, power available to the input of DUT, and power at the output of the DUT is calculated. FIG. 8 shows an exemplary calibration data set resulting from a system calibration.

Figure 4:
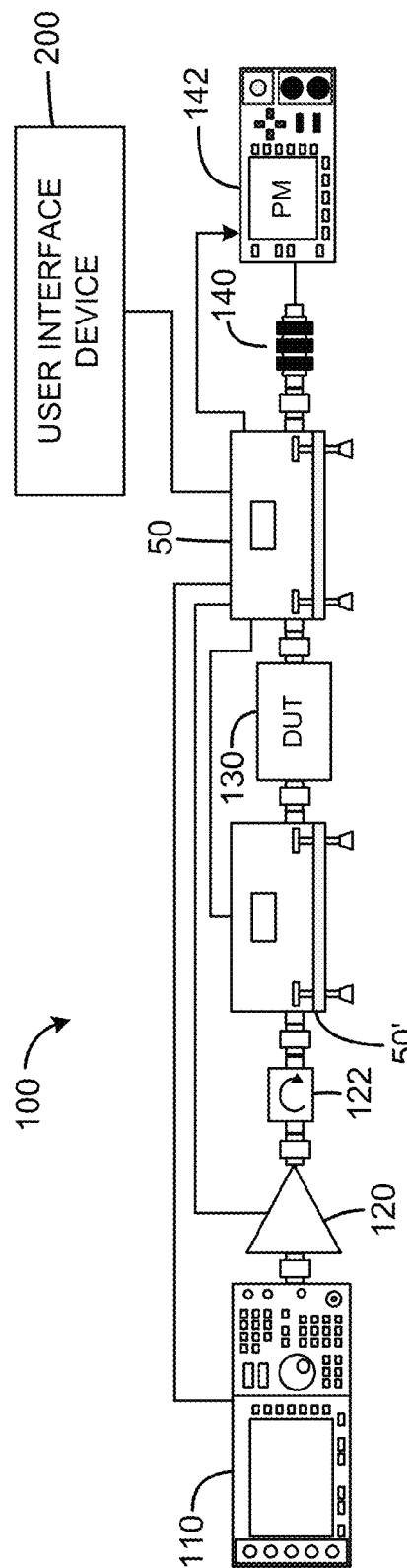
FIG. 4 illustrates a block diagram of an exemplary embodiment of a tuner system connected to a DUT for measurement.

Other calibration techniques include using power meters for forward and reverse reflected power to determine power delivered to the DUT or a vector-receiver measuring incident and reflect waves in order to determine power delivered to the DUT. The measurement system can include more than one impedance tuner, as shown in FIGS. 3 and 4, in which a load tuner 50 and an input tuner 50' are arranged on input and load sides of the DUT, with the load tuner 50 controlling operation of the measurement system and the system devices, including the input tuner 50'. Additional tuners can also be used in some measurement system applications.

External software is typically used to perform system calibration. This software resides on an external computer, and contains software drivers to communicate with external instruments or system devices connected in a measurement system. Software drivers contain specific commands that may be unique to each instrument. The external software also contains the system calibration algorithm which drives the tuner, communicates with the various instruments via drivers, and records calibration data in a table or database. Exemplary calibration procedures and algorithms are described in the operating manual for the Maury Microwave impedance tuner, MT993-2, Rev M, Chapter 5, September 2008, by way of example.

Measuring the DUT's parameters involves replacing the THRU from the system calibration with the DUT, as shown in FIG. 4.

External software is typically used to measure the DUT's parameters. This software resides on an external computer, and contains software drivers to communicate with external instruments. Software drivers contain specific commands that may be unique to each instrument. The external software also contains the DUT measurement algorithm which drives the tuner, communicates with the various instruments via drivers, and records measured parameter data in a table or database. US Publication 20100030504 describes an exemplary DUT parameter measurement algorithm, a noise measurement algorithm.

In accordance with exemplary embodiments of the invention, for the first time, one or more instrument drivers, characterization, calibration and measurement algorithms are embedded into an impedance tuner's controller, so that, in addition to converting user commands into electronic signals for controlling the impedance-varying system, users have the capability to access and execute these functions, e.g., via a GUI (graphical user interface) applet or user interface devices, without use of an external computer to store the system software drivers and execute the algorithms. "Embedding" the drivers and algorithms means that they are stored in memory or firmware of the impedance tuner controller, in contrast to being stored on an external computer device and not locally on the impedance tuner controller. An external communication device 200 (FIGS. 3 and 4) may be used to allow a user to run the applet on the external device to provide user command instructions to the tuner controller. The external communication device may be a cell phone, laptop or tablet computer, or a desktop computer, for example. In this case, the external communication device does not store the system device drivers, and the characterization, calibration and measurement algorithms, which are embedded on the tuner controller. Rather, the external communication device is used to send high level user command instructions to the tuner controller, e.g. to initiate the particular function or functions to be performed.

The external communication device 200 may be connected to the tuner controller by a Wi-Fi, Bluetooth or cellular network, an Internet connection or by a cable connection. Alternatively, a user interface device such as a mouse and/or keyboard may be used, in conjunction with a display mounted to the tuner device or controller housing, to access and control the tuner functions, such as characterization, calibration and measurement functions. The communication ports of the tuner controller include ports configured to communicate command signals to controlled devices in a measurement system, in a system in which the tuner 10 is configured to control the measurement system, e.g. through characterization, calibration, and measurement modes or functions. The communication port may include an antenna for wireless communication using networks such as Wi-Fi, Bluetooth or cellular networks.

Figure 1A:
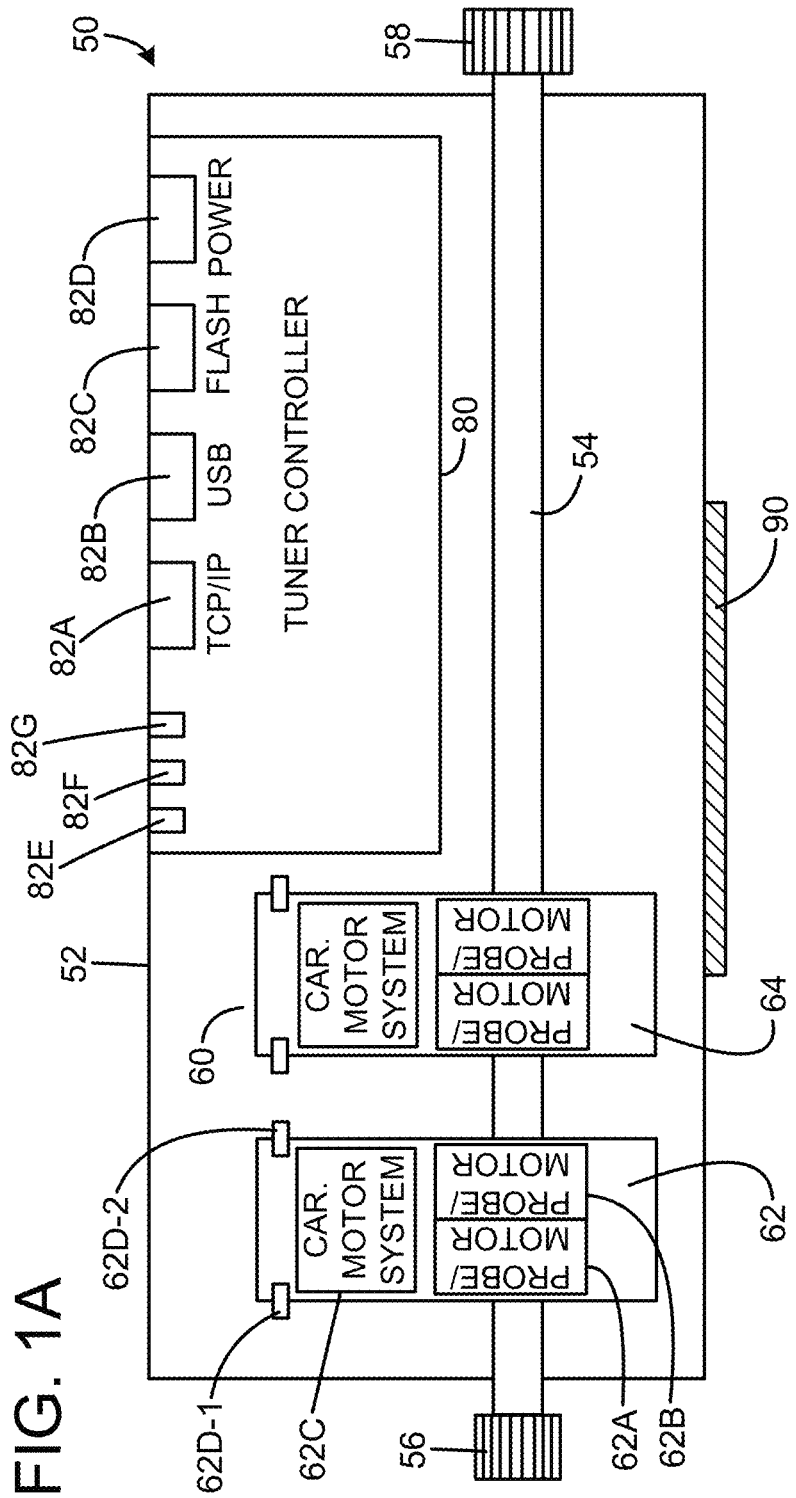
FIG. 1A diagrammatically illustrates an exemplary embodiment of an electromechanical impedance tuner system.
Figure 1C:
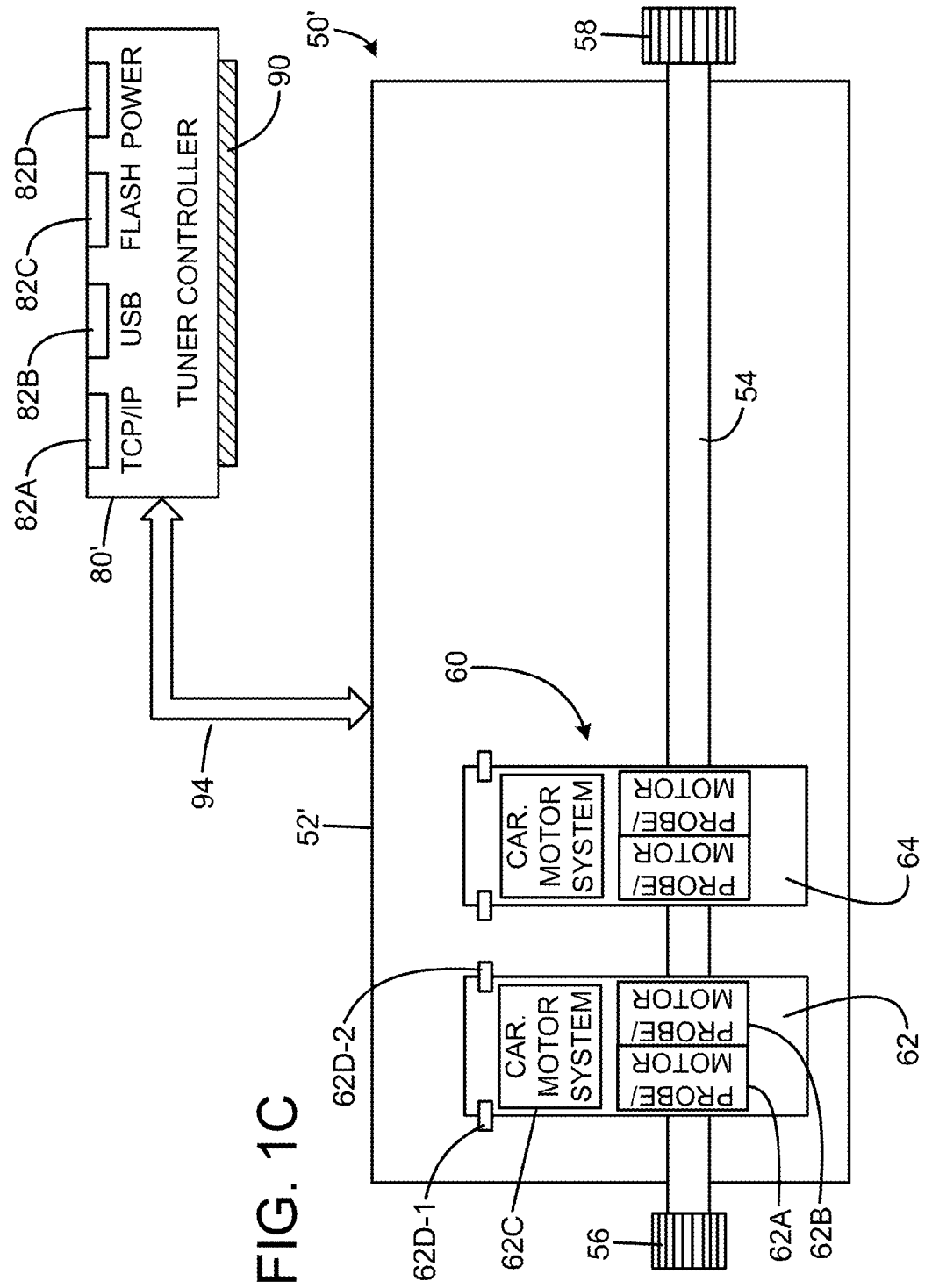
FIG. 1C diagrammatically illustrates an exemplary embodiment of an electromechanical impedance tuner system with external controller system.
Figure 1D:
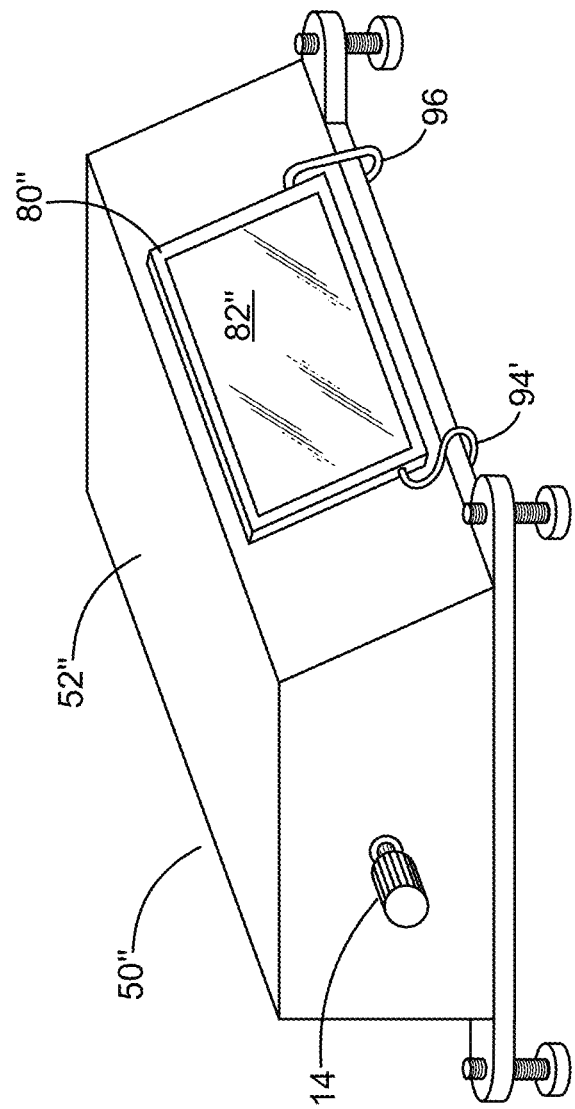
FIG. 1D illustrates an exemplary embodiment of a tuner system with a flat panel display or a tablet computer mounted to the tuner housing.

FIG. 1D illustrates an exemplary embodiment of a tuner 50" in which the tuner controller 80" includes a tablet computer, which can be mounted to the housing structure 52" of the tuner. A computer port such as a USB port of the tablet computer is connected to the tuner by a USB cable 94'.

Electrical power can be supplied to the table computer by a power cable 96. The tablet computer can be one of the tablets configured to run the Windows operating system, for example; in other embodiments, tablets running other operating systems can be configured for use. The tablet computer 80" includes in this example a touch screen 82" for user manipulation to input commands and control operation of the tuner system, to convert user commands, such as desired gamma settings for a selected frequency, into electronic control signals for controlling the impedance-varying system, as well as to control the measurement system devices to execute the characterization, calibration and measurement functions. The instrument drivers, and the characterization, calibration and measurement algorithms may be stored on the tablet memory storage drive, for example. The tablet computer can be mounted to the cover by a tablet holder structure permitting removal of the tablet from the housing structure. Alternatively, the housing structure may include an open window, and the tablet computer mounted to the inside surface of the housing structure, with the screen 82" accessible and visible through the window.

In an exemplary embodiment, the self-characterizing, self-calibrating and self-measuring impedance tuner or tuner controller is web-enabled, including features described in application Ser. No. 13/081,462, filed Apr. 6, 2011, now issued as U.S. Pat. No. 8,823,392, the entire contents of which are incorporated herein by this reference, and sometimes referred to herein as the '462 application. While an exemplary embodiment is configured to perform all three functions, i.e. the self-characterizing, self-calibrating and self-measuring functions, there may be applications in which an embodiment of an impedance tuner is configured to implement only one of these functions, or for only two of the functions. For example, an impedance tuner controller may be configured to implement only self-characterizing and self-calibrating functions, and not the self-measuring function.

An exemplary embodiment of a self-characterizing, self-calibrating and self-measuring impedance tuner may work in conjunction with a web-enabled tuner controller which can be configured and controlled from a standard web browser, such as Microsoft Explorer, Mozilla Firefox, Google Chrome, and Apple Safari, via a TCP/IP based network. Alternatively, the impedance tuner can be controlled by a tuner controller which is configured and controlled by user input devices such as a mouse, keyboard or touch screen. The self-characterizing, self-calibrating and self-measuring tuner or tuner controller may include one or more of the following features:

1) A built-in or integrated, tuner controller 80 (FIG. 1A). This will avoid the need for the customer to connect a stand-alone controller to the tuner, through a jack or USB connector, to provide control signals to the carriage motors (for a mechanical tuner) or to switches for a solid state tuner, and to process the sensor signals. The built-in controller may be microprocessor-based, or fabricated as an application specific integrated circuit (ASIC) or field programmable gate array (FPGA). The built-in controller may be web-enabled.

2) A tuner controller 80' (FIG. 1C) external to the tuner, and configured for connection to the tuner by, e.g., a USB or other communication link. The external tuner controller may be web-enabled.

3). A tablet computer with a touch sensitive screen, as part of the tuner controller 80" (FIG. 1D) mounted or supported by the tuner housing 4) A server function integrated on the tuner, or with the tuner controller.

5) The tuner controller is configured so that the tuner operator can use a computer or terminal, a user interface device 200, such as a tablet, laptop, PC or smart phone, with a client application such as a web browser to navigate to the IP address of the tuner, which can be configured to download a web page or pages to the terminal. The web pages provide a visual or graphical interface for the user to set up and control the operation of the tuner. The operational instructions to the tuner are processed by the tuner controller, for example, to determine the motor commands needed to obtain the desired tuner operation in the case of an electromechanical tuner, or determine solid state control conditions, e.g. in the case PIN diodes, the diode bias conditions, for a solid state electronic tuner. The algorithms (84C, 84D, 84E, FIG. 1B) for the tuner characterization, calibration and measurement modes, as well as the measurement system device drivers, all reside on the tuner controller, i.e. are stored on memory or firmware of the tuner controller.

6) The web page may include an embedded JAVA applet, providing the capability of graphical tuner control, and opening a Telnet communication channel to the tuner and allowing text-based command signals to be sent to the tuner from the PC. In an exemplary embodiment, the JAVA applet runs on the PC, and provides on the PC:
   (i) a visual setup web page for the tuner,
   (ii) an instrument driver manager,
   (iii) a configuration page for tuner characterization,
   (iv) a measurement page for tuner characterization,
   (v) a configuration page for system calibration,
   (vi) a measurement page for system calibration,
   (vii) a measurement page for DUT parameter measurement, 7) The tuner web page may be configured to allow textual web tuning by typing a tuning target or other tuner data point or command in a text box (e.g. in an HTML page) without a JAVA applet, and the controller retrieves data entered by user from the HTML page and acts on this information to control the tuner.

8) An on-board file system with the controller acting as an FTP server. FTP client software, such as File Explorer, on a PC can be used to access on-board file system, allowing files to be transferred between the PC and tuner. The on-board file system in an exemplary embodiment is configured to store calibration and s-parameter data files, as well as configuration and setup data. The on-board file system may also store measurement data.

9) A set of connectors for providing control signals to other devices in the measurement system, such as a signal generator and power meter. Alternatively, the tuner controller may be connected on a network with the other devices, on a signal buss, for example.

10) Tuner characterization, calibration and measurement algorithms (84C, 84D, 84E, FIG. 1B) and system device drivers (84F) are resident on the tuner controller memory or firmware.

As noted above, the web-enabled tuner controller 80' (FIG. 1C) may be external to the tuner, and connected to the tuner by a communication link. A user at a PC or other terminal can still control the tuner through commands transmitted to the tuner controller, which in turn processes the commands and generates the appropriate tuner control or drive commands as well as the measurement system device commands to perform the characterization, calibration and/or measurement functions. This embodiment may be useful to control existing, tuner systems already deployed in the field, for example, without requiring expensive retrofits.

FIG. 1A shows an exemplary embodiment of an electromechanical impedance tuner system 50. In this example, the impedance tuner includes a housing structure generally indicated as 52, and an RF signal transmission line 54, in this example a slab line, with input/output (I/O) ports 56, 58 for connection to a DUT, signal source, termination, network analyzer or other equipment in a measurement or calibration setup. The impedance varying system 60 in this embodiment includes one or multiple (two are shown in this example) carriages 62, 64, each mounting one or multiple probes (two in this example) and a motor system. Thus, carriage 62 includes probes/motors 62A and 62B, each mounted for movement transverse to the slabline and including a drive motor for imparting probe movement in directions transverse to the longitudinal axis of the signal transmission line 54, and a carriage motor system 62C for moving the carriage along the longitudinal axis of the transmission line. By moving the probes closer to or away from the transmission line, the impedance of the transmission line is varied. Limit switches 62D-1 and 62D-2 are mounted at opposite sides of the carriage 62 to provide position signals which may be used in initialization and collision alert/avoidance of the carriages. Carriage 64 is similarly equipped. Other tuner systems may employ other combinations of elements. Motor drive circuits may reside on a separate circuit board, and respond to commands from the tuner controller.

The tuner 50 includes an integrated controller 80, and a display 90. The controller for the tuner has several connectors or ports, in this case a TCP/IP port 82A, a USB port 82B, a connector 82C configured for an SD flash memory card, and a power port 82D for providing power to the tuner system. The controller 80 may further support additional connectors or ports, e.g. 82E, 82F, 82G, which may provide control signals to other devices in a measurement system, e.g. a signal generator, signal amplifier, power meter, signal analyzer, and the like.

FIG. 1B is a simplified controller functional block diagram, of exemplary functions implemented by the controller 80. Major functions include tuning control 84B to create the electronic control signals to control the electronic impedance varying system 20, tuner characterization algorithms 84C, calibration algorithms 84D, measurement algorithms 84E, and system device drivers 84F. The system device drivers may include, for example, RF signal generator driver 84F1, RF amplifier driver 84F2, power meter driver 84F3 and VNA driver 84F4. The system device drivers are software drivers which allow the tuner controller to also control the operation of measurement system devices. The controller 80 may also include in an exemplary embodiment communication servers 84G (e.g., Wi-Fi (84G1), Bluetooth (84G2), Telnet (84G3), FTP (file transfer protocol) 84G4 and HTTP (Hypertext Transfer Protocol) 84G5) in this exemplary embodiment), a command interpreter 84H, TCP/IP socket support 84I and USB support 84J, and the file system 84K. The file system may include files such as calibration data 84K1, de-embedding data 84K2, web pages 84K3, JAVA applets 84K4, setup definition data files 84K5, configuration data 82K6 and measurement data files (85K8).

The Wi-Fi (84G1) and Bluetooth (84G2) server functions enable wireless communication between a user interface computer device 200 (FIGS. 3 and 4) and the tuner controller, to control operation of the tuner and measurement system. The device 200 can be a smart phone, tablet laptop, desktop computer, or the like.

The HTTP server 84G5 delivers web pages on request to the client, and is also used to receive and process content posted back from the client.

The FTP server 84G4 allows moving files between external client computers and the file system of the controller over a TCP/IP based network.

The Telnet server 84G3 enables bi-directional interactive text-oriented communication over the TCP/IP network.

In an exemplary embodiment, the file system, e.g. a FAT (file allocation table), on the controller non-volatile memory is used to store:

(i) web pages (84K3) and Java applets (84K4) to be sent by the HTTP server to the client, the user interface device (200);

(ii) tuner configuration (84K6) and calibration data (84K1);

(iii) s-parameter de-embedding data (84K2) for fixtures and other setup components;

(iv) setup definition files (84K5); and (v) firmware files (84K7).

The file system can be remotely accessed via the FTP server over the TCP/IP network established between the tuner controller and a client computer system. Files can be transferred over the network.

HTTP, FTP and Telnet servers are per se well known.

In an exemplary embodiment, the communication servers are running concurrently in the controller 80, and all incoming requests and postings are forwarded to the command interpreter 84H which in turn will check the command syntax and initiate appropriate action, such as dispatching tuning commands or returning status information to the client.

The tuning control function 84B uses tuner calibration and de-embedding data loaded from the file system 84K to translate tuning commands received from the command interpreter into control signals for the impedance varying system, e.g. motion control signals for electro-mechanical tuners or solid state element control signals for electronic tuners.

The Telnet server may be omitted for applications employing HTTP based tuning control, in which the user-entered data are transmitted back to the tuner from the client using an HTTP protocol (e.g., GET and POST method).

The controller 80 can be configured to run, in an exemplary embodiment, the LXI standard instrument control protocol, described more fully at LXI.org.

The user interface device 200 may be configured to run an HTTP client software application such as a web browser, e.g. Windows Explorer, Mozilla Firefox or Apple Safari. The user utilizes the browser to navigate to the IP address of the tuner (which for convenience can be displayed on the tuner display), using an HTTP channel established between the tuner controller and the device 200. The browser fetches (from the tuner controller) and displays the tuner main web page (shown in FIG. 6 of the '462 application) that includes several command buttons. Clicking the "TUNER APP" button, for example, will display the tuning web page with an embedded JAVA applet.

FIG. 1C illustrates an alternate embodiment, in which the controller 80' is external to the housing 52' of the impedance tuner 50', and is electrically connected to the tuner 50' through a communication channel 94 such as a USB connection. The controller 80' may be web-enabled, and is otherwise as described above regarding the controller 80 of FIG. 1B.

Figure 5:
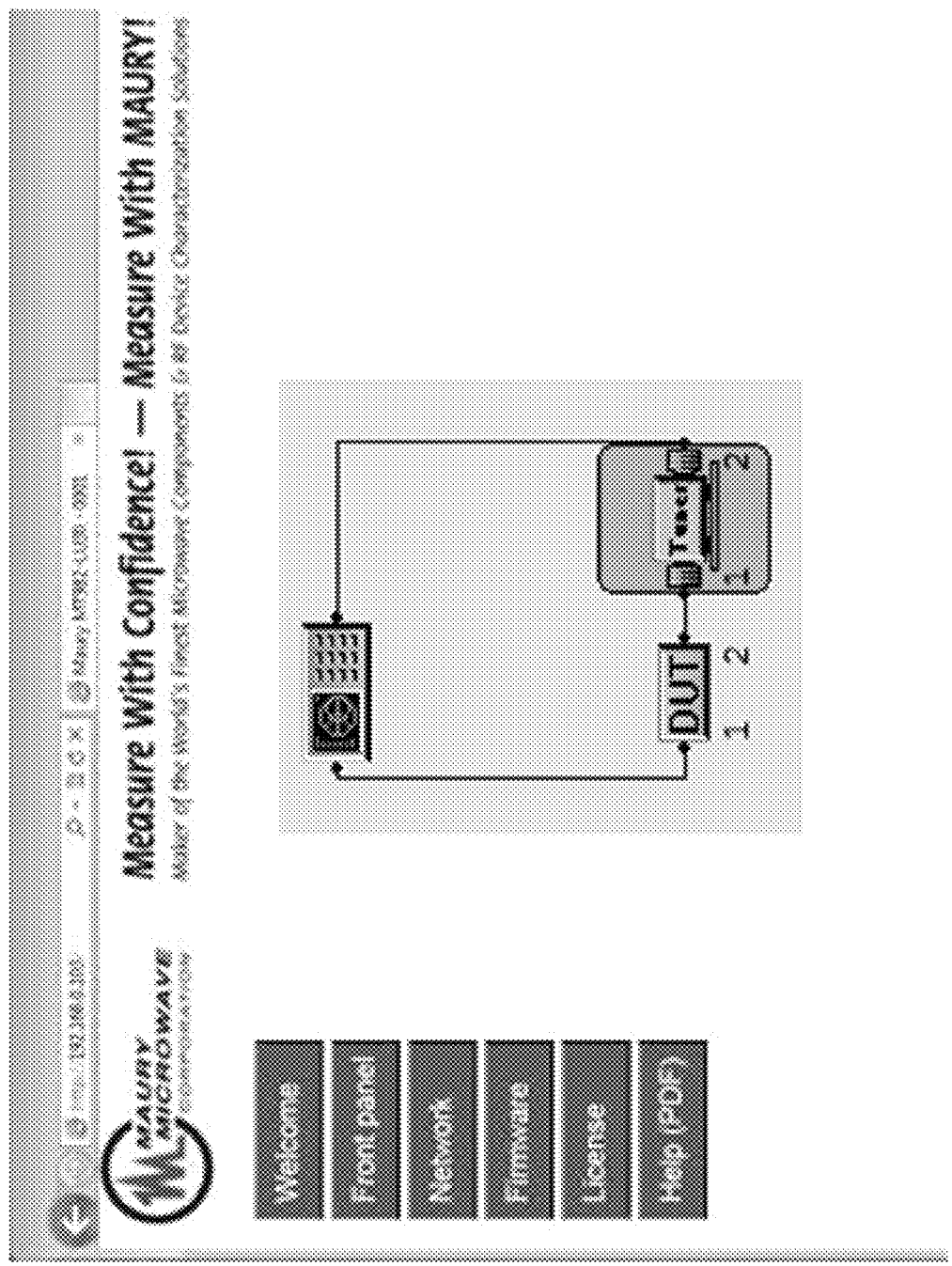
FIG. 5 shows a screen shot on an exemplary TUNER APP characterization configuration page.

FIG. 5 is an exemplary screen shot of an exemplary tuner characterization configuration page. Users can define and select drivers for associated instruments, such as a VNA, which are stored on the controller 80 file system. In an exemplary embodiment, only the TUNER APP page embeds a JAVA applet, all other pages are based on HTTP only. The tuner characterization page shows schematic representations of the tuner and the VNA. The DUT is shown only for tuner orientation. If the tuner were to be used on the input of the DUT, it would appear on the left of the DUT; in this example, the tuner is to be used as a load tuner, and is shown on the right of the DUT.

Figure 6:
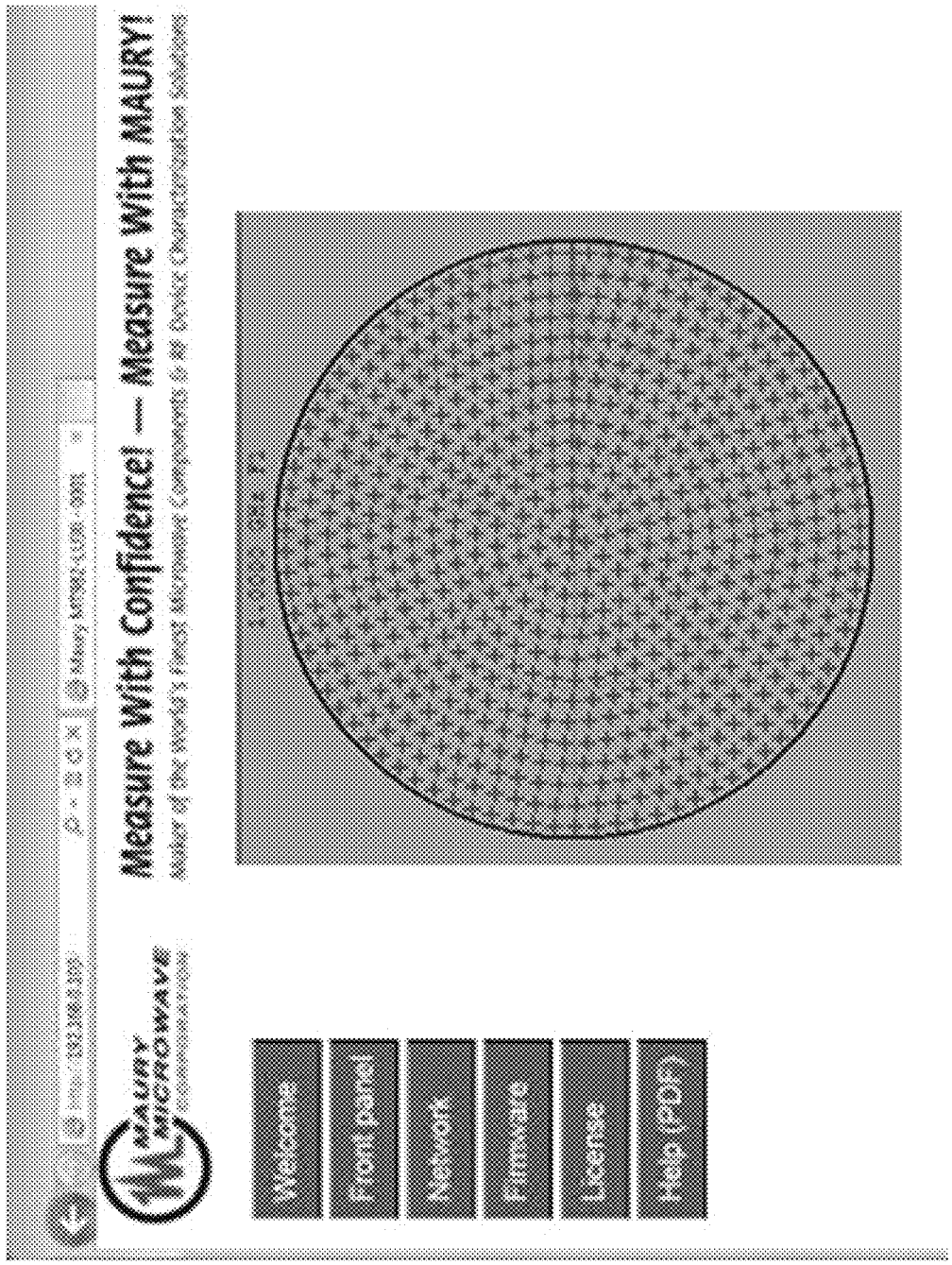
FIG. 6 shows a screen shot on an exemplary TUNER APP characterization measurement page.

FIG. 6 is an exemplary screen shot of an exemplary tuner characterization measurement data page. The characterization of the tuner as defined earlier is executed by the tuner characterization algorithms (84C), and the resulting data is saved into a table, e.g. for viewing as a Smith chart characterization.

Figure 7:
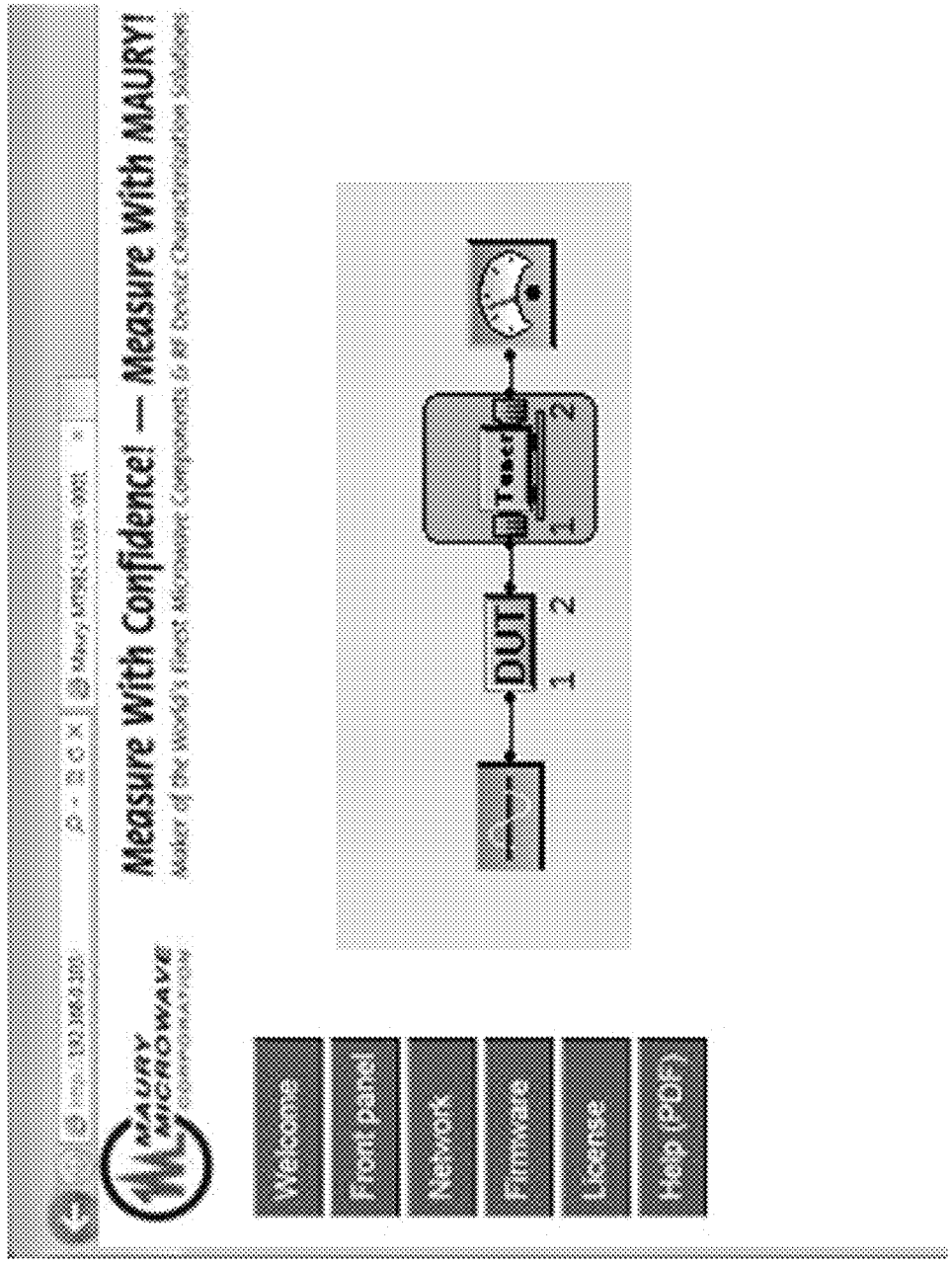
FIG. 7 shows a screen shot on an exemplary TUNER APP system calibration configuration page.

FIG. 7 is an exemplary screen shot of an exemplary system calibration configuration page, showing schematically the signal generator, the tuner and a power meter. Users can define and select drivers for associated instruments. The DUT is replaced with a THRU for calibration.

FIG. 8 is an exemplary screen shot of an exemplary system calibration measurement page. The system calibration algorithm, as defined earlier, is executed and the resulting data is saved into a table, stored in file system 84K of the controller.

Although the foregoing has been a description and illustration of specific embodiments of the subject matter, various modifications and changes thereto can be made by persons skilled in the art without departing from the scope and spirit of the invention. For example, it is well known that the computer and software technologies advance and change rapidly. Therefore, other software languages, interfaces and communication protocols that either currently exist or may become available in the future could be used in other embodiments of this invention. For example, while the embedded applet has been described above as a JAVA applet, other applets developed with other languages such as C# (Microsoft), F# (Microsoft) could be employed as well. It is also well known that measurement equipment and types of measured data change as technologies advance. For example, a vector receiver or a noise receiver could be used with or instead of the RF source and power meter described herein, e.g., with respect to FIGS. 3, 4 and 7.

What is claimed is:

1. An impedance tuner system, usable in a measurement system including at least one other system device, the tuner system comprising:
  an impedance tuner, including a signal transmission line and an impedance-varying system coupled to the transmission line, and responsive to command signals to vary the impedance presented by the impedance tuner; and
  an impedance tuner controller connected to the impedance-varying system by a signal communication link and configured to generate the command signals, and wherein at least one system device driver and at least one of characterization, calibration and measurement algorithms for corresponding characterization, calibration and measurement functions of the measurement system are embedded into the tuner controller, the tuner controller configured to allow a user to control execution of said at least one of said characterization, calibration and measurement algorithms using said tuner controller, including controlling the at least one other system device in the execution of the at least one algorithm.

2. The system of claim 1, wherein said impedance tuner controller is configured to allow a user to control execution of said at least one of said characterization, calibration and measurement algorithms without use of an external computer.

3. The system of claim 1, wherein said impedance tuner controller is mounted within a housing structure which houses the signal transmission line and the impedance-varying system.

4. The system of claim 1, wherein said impedance tuner controller is an external unit mounted outside a tuner housing structure.

5. The system of claim 1, wherein said impedance tuner controller comprises a tablet computer supported by a tuner housing structure which houses the signal transmission line and the impedance-varying system.

6. The system of claim 1, wherein the impedance varying system is an electromechanical system with one or more probes mounted on one or more probe carriages, and motors for moving the probes and carriages in the horizontal and vertical axes relative to a transmission line axis.

7. The system of claim 1, wherein the impedance varying system is a solid state system, with impedance variation achieved by applying the command signals to solid state elements.

8. The system of claim 1, wherein the tuner controller is configured to generate control signals to the at least one other system device.

9. The system of claim 1, wherein all of said characterization, calibration and measurement algorithms are embedded into the tuner controller, the tuner controller configured to allow a user to control execution of all of said characterization, calibration and measurement algorithms.

10. The system of claim 1, wherein the measurement system devices includes a second tuner system, and said tuner controller is further configured to generate control signals to control said second tuner system in the measurement system.

11. The system of claim 1, wherein the tuner controller includes a set of connectors configured for signal connection to each of the at least one other system devices in the measurement system to transmit the control signals to the devices.

12. The system of claim 1, wherein said at least one other system device comprises a signal generator or a power meter.

13. An RF measurement system comprising:
  at least one measurement system device controlled by electronic control signals;
  a software driver for each of said at least one measurement system devices;
  an impedance tuner including a signal transmission line and an impedance-varying system coupled to the transmission line, and responsive to command signals to vary the impedance presented by the impedance tuner; and
  an impedance tuner controller configured to generate the command signals, and wherein said software driver for said at least one measurement system device and at least one of characterization, calibration and measurement algorithms for corresponding characterization, calibration and measurement functions are embedded into the tuner controller, the tuner controller configured to allow a user to control execution of said at least one of said characterization, calibration and measurement algorithms using said tuner controller, said tuner controller further configured to generate the electronic control signals to said at least one measurement system device using said software driver, wherein the tuner controller executes and controls the corresponding at least one of the characterization, calibration or measurement functions of the measurement system.

14. The system of claim 13, wherein said at least one measurement system device includes an RF source and a power meter.

15. The system of claim 13, wherein said at least one measurement system device includes a vector network analyzer, a vector receiver or a noise receiver.

16. The system of claim 13, wherein said impedance tuner controller is configured to allow a user to control execution of said at least one of said characterization, calibration and measurement algorithms without use of an external computer.

17. The system of claim 13, wherein said impedance tuner controller is mounted within a housing structure which houses the signal transmission line and the impedance-varying system.

18. The system of claim 13, wherein said impedance tuner controller is an external unit mounted outside a tuner housing structure.

19. The system of claim 13, wherein said impedance tuner controller comprises a tablet computer supported by a tuner housing structure which houses the signal transmission line and the impedance-varying system.

20. The system of claim 13, wherein the impedance varying system is an electromechanical system with one or more probes mounted on one or more probe carriages, and motors for moving the probes and carriages in the horizontal and vertical axes relative to a transmission line axis.

21. The system of claim 13, wherein the impedance varying system is a solid state system, with impedance variation achieved by applying the command signals to solid state elements.

* * * * *